United States Patent
Bayan et al.

(10) Patent No.: US 6,399,415 B1
(45) Date of Patent: Jun. 4, 2002

(54) ELECTRICAL ISOLATION IN PANELS OF LEADLESS IC PACKAGES

(75) Inventors: Jaime Bayan, Palo Alto; Peter Howard Spalding, Cupertino, both of CA (US); Harry Cheng Hong Kam, Melaka (MY); Ah Lek Hu, Melaka (MY); Sharon Mei Wan Ko, Melaka (MY); Santhiran Nadarajah, Malacca (MY); Aik Seng Kang; Yin Yen Bong, both of Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/528,658

(22) Filed: Mar. 20, 2000

(51) Int. Cl.[7] .......................... H01L 21/44; H01L 21/48; H01L 21/50
(52) U.S. Cl. ....................... 438/106; 438/110; 438/113; 257/692
(58) Field of Search ................. 257/678, 692, 257/706, 782, 787; 438/15, 106, 110, 113, 114, 464

(56) References Cited

U.S. PATENT DOCUMENTS

| | | | |
|---|---|---|---|
| 5,367,196 A | 11/1994 | Mahulikar et al. | 257/787 |
| 5,494,207 A | 2/1996 | Asanasavest | 228/110.1 |
| 5,508,556 A | 4/1996 | Lin | 257/691 |
| 5,596,231 A | 1/1997 | Combs | 257/776 |
| 5,623,123 A | 4/1997 | Umehara | 174/52.2 |
| 5,656,550 A | 8/1997 | Tsuji et al. | 438/123 |
| 5,741,729 A | 4/1998 | Selna | 438/125 |
| 5,844,315 A | 12/1998 | Melton et al. | 257/738 |
| 5,854,511 A | 12/1998 | Shin et al. | 257/713 |
| 5,866,948 A | 2/1999 | Murakami et al. | 257/778 |
| 5,981,314 A | 11/1999 | Glenn et al. | 438/127 |
| 5,990,545 A * | 11/1999 | Schueller et al. | 257/697 |
| 6,013,946 A * | 1/2000 | Lee et al. | 257/684 |
| 6,060,774 A | 5/2000 | Terui | 257/692 |
| 6,060,778 A | 5/2000 | Jeong et al. | 257/710 |
| 6,093,960 A | 7/2000 | Tao et al. | 257/706 |
| 6,133,070 A | 10/2000 | Yagi et al. | 438/121 |
| 6,177,288 B1 * | 1/2001 | Takiar | 438/15 |
| 6,188,130 B1 | 2/2001 | Ramirez et al. | 257/706 |

FOREIGN PATENT DOCUMENTS

| | | |
|---|---|---|
| GB | 2 059 157 A | 4/1981 |
| JP | 3-108745 | 5/1991 |

OTHER PUBLICATIONS

Leadless Leadframe Package (LLP), National Semiconductor Application Note 1187, Sep. 2000.*

* cited by examiner

Primary Examiner—Richard Elms
Assistant Examiner—Christian D. Wilson
(74) Attorney, Agent, or Firm—Beyer Weaver & Thomas, LLP (57) ABSTRACT

A variety of techniques for electrically debussing conductive substrate panels used in the formation of a matrix of leadless integrated circuit packages are described. Generally, after a matrix of leadless packages have been fabricated in panel form on a conductive substrate panel, tie bars that are used to support contacts and potentially other structures on the conductive substrate are removed after plastic caps have been molded over the matrix, but before separating the packaged devices. This serves to electrically isolate the contacts from one another while leaving sufficient portions of the molded substrate structure in tact to facilitate handling the structure in panel form. With the described arrangement, the packaged devices may be tested in panel form. After testing and any other desired panel based operations, the packaged devices may be separated using conventional techniques. The removal of the tie bars can be accomplished by any suitable technique including, for example, sawing or etching.

10 Claims, 8 Drawing Sheets

ELECTRICAL ISOLATION IN PANELS OF LEADLESS IC PACKAGES

CROSS REFERENCE TO RELATED APPLICATIONS

This application is related to commonly assigned U.S. patent application Ser. Nos. 09/528,540, 09/528,539, 09/528,662, and 09/616,228 filed concurrently herewith, each of which are incorporated herein by reference.

BACKGROUND OF THE INVENTION

The present invention relates generally to the bulk packaging of integrated circuits. More particularly, the invention relates to processes that facilitate panel testing of leadless IC packages that use a conductive substrate.

Figure 1A:
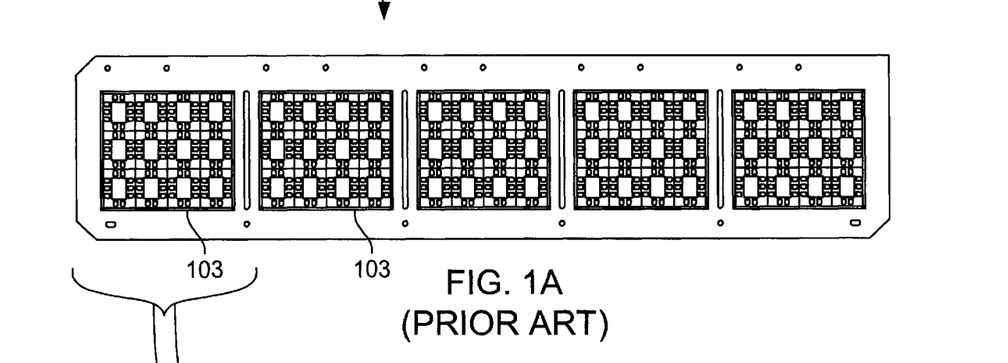
FIG. 1 is a diagrammatic top view of a conventional lead frame strip suitable for use in forming leadless leadframe packages.
Figure 1B:
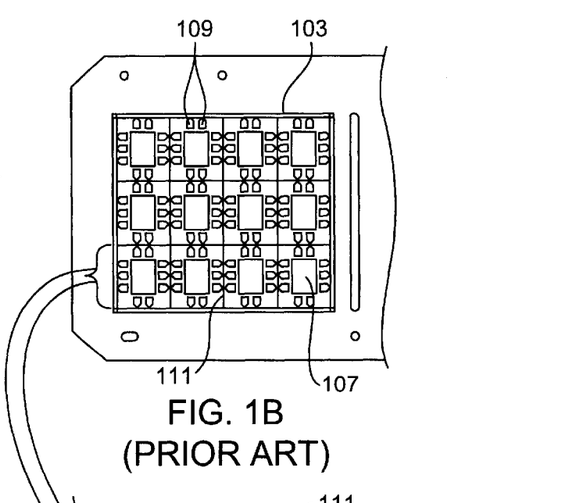
Figure 1C:
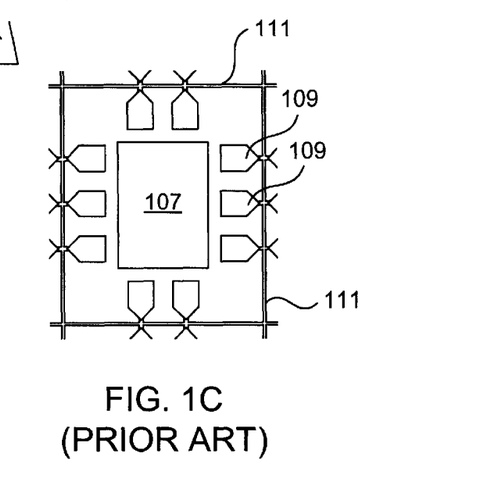

A leadless leadframe package (LLP) is a relatively new integrated circuit package design that contemplates the use of a metal (typically copper) leadframe type substrate structure in the formation of a chip scale package (CSP). As illustrated in FIG. 1, in typical leadless leadframe packages, a copper leadframe strip or panel 101 is patterned (typically by stamping or etching) to define a plurality of arrays 103 of chip substrate features 105. Each chip substrate feature 105 includes a die attach pad 107 and a plurality of contacts 109 disposed about their associated die attach pad 107. Very fine tie bars 111 are used to support the die attach pads 107 and contacts 109.

During assembly, dice are attached to the respective die attach pads and conventional wire bonding is used to electrically couple bond pads on each die to their associated contacts 109 on the leadframe strip 101. After the wire bonding, a plastic cap is molded over the top surface of the each array 103 of wire bonded dice. The dice are then singulated and tested using conventional sawing and testing techniques. The dice cannot be tested prior to singulation since the tie bars remain in place and therefor electrically connect the contacts 109 until the devices are separated.

Figure 2:
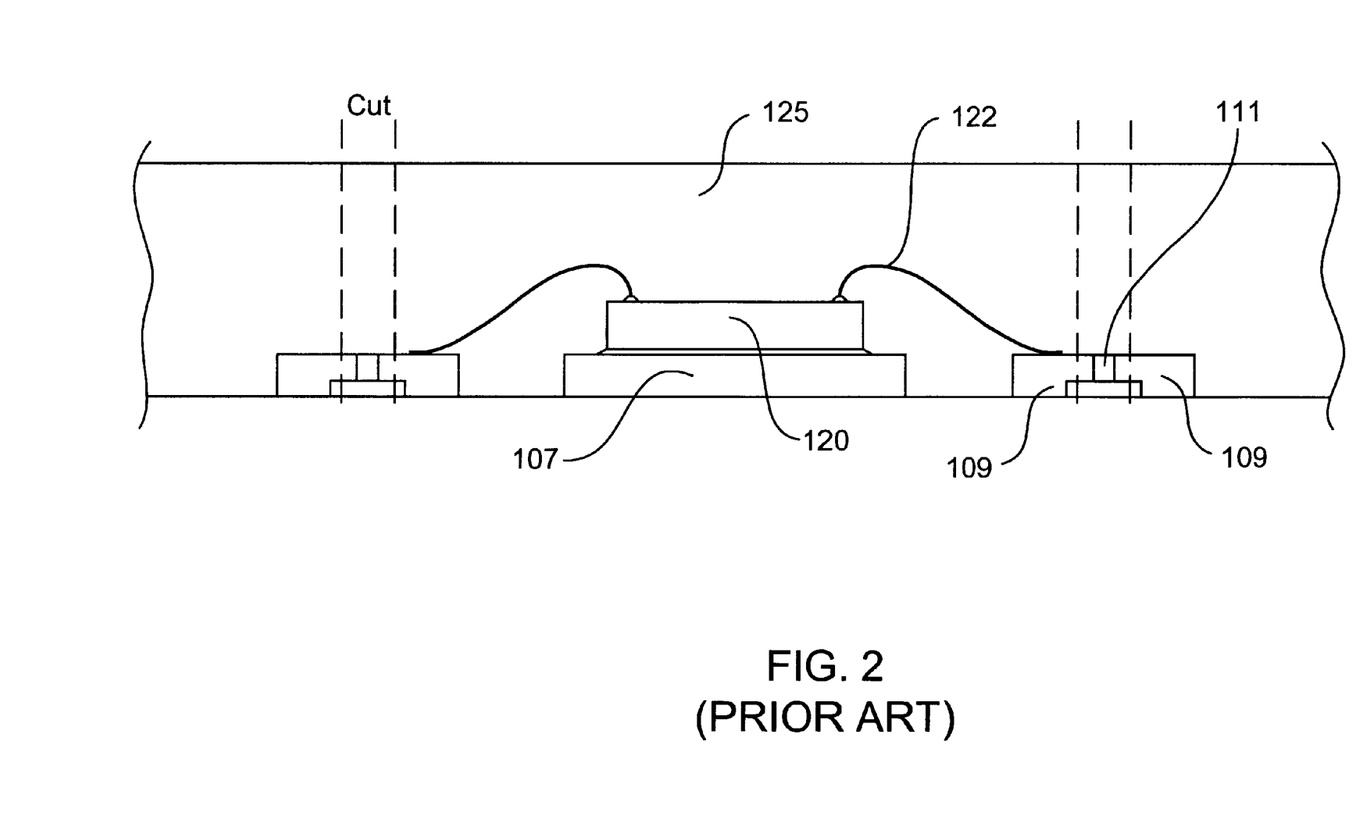
FIG. 2 is a diagrammatic cross sectional side view of a conventional leadless leadframe package.

FIG. 2 illustrates a typical resulting leadless leadframe package. The die attach pad 107 supports a die 120 which is electrically connected to its associated contacts 109 by bonding wires 122. A plastic cap 125 encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip can then be surface mounted on a printed circuit board or other substrate using conventional techniques.

Although leadless leadframe packaging has proven to be a cost effective packaging arrangement, there are continuing efforts to further reduce the costs associated with packaging. One persistent issue in packaging generally is the need and desire to test the packaged devices. In high density packaging applications such as some of the state of the art leadless packaging, it would be advantageous to be able to test the devices in panel form rather than individually after singulation.

SUMMARY OF THE INVENTION

To achieve the foregoing and other objects and in accordance with the purpose of the present invention, a variety of techniques for electrically debussing conductive substrate panels used in the formation of a matrix of leadless integrated circuit packages are described. Generally, a matrix of leadless packages are fabricated in panel form on a conductive substrate panel. The substrate panel has one or more arrays of device areas thereon. Each device area includes a plurality of contacts formed from the substrate panel and which are electrically connected to an associated die (which is optionally supported by a die attach pad formed from the same substrate panel). The conductive substrate panel also defines a plurality of tie bars that support the contacts during fabrication. After the dice have been mounted and electrically connected to their associated contacts, at least one cap is molded over the substrate panel. Each cap is arranged to encapsulate an array of the devices. With this arrangement, the molding material serves to hold the contacts and dice in place relative to one another. After the molding operation, portions of the tie bars are removed to electrically isolate the contacts from one another while leaving sufficient portions of the molded substrate structure in tact to facilitate handling the structure in panel form.

With the described arrangement, the packaged devices may be tested in panel form. After testing and any other desired panel based operations, the packaged devices may be separated using conventional techniques. The removal of the tie bars can be accomplished by any suitable technique including, for example, sawing or etching.

BRIEF DESCRIPTION OF THE DRAWINGS

The present invention is illustrated by way of example, and not by way of limitation. In the accompanying drawings like reference numerals refer to similar elements.

DETAILED DESCRIPTION OF THE INVENTION

An arrangement and method for electrically testing a matrix of leadless packages formed on a conductive substrate is described. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In conventional leadless packaging wherein an array of devices are packaged in parallel on a conductive substrate panel, it is not possible to test the packaged devices in panel form because the tie bars electrically couple all of the contacts. To address this problem, the present invention contemplates effectively removing the tie bars after the packaging has been substantially completed, but before the devices are singulated. This permits panel based testing of the packaged devices.

Figure 3A:
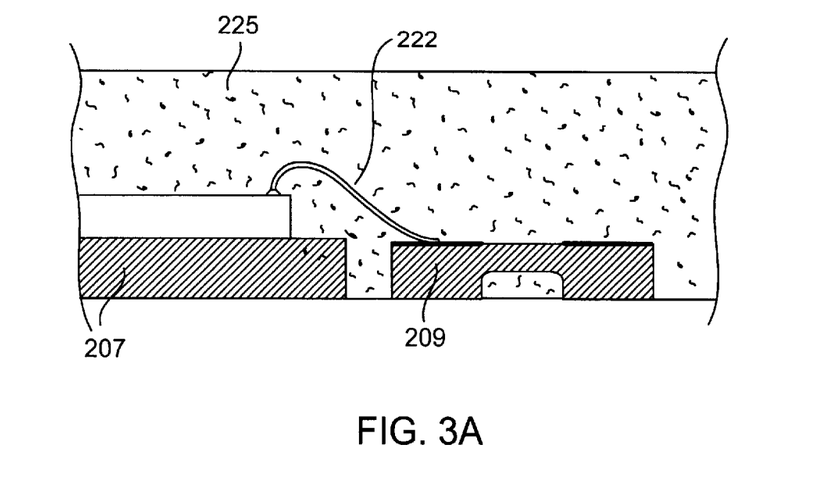
FIG. 3(a) is a diagrammatic cross sectional partial side view of a leadless package design illustrating the region of a tie bar in accordance with one embodiment of the present invention.
Figure 3B:
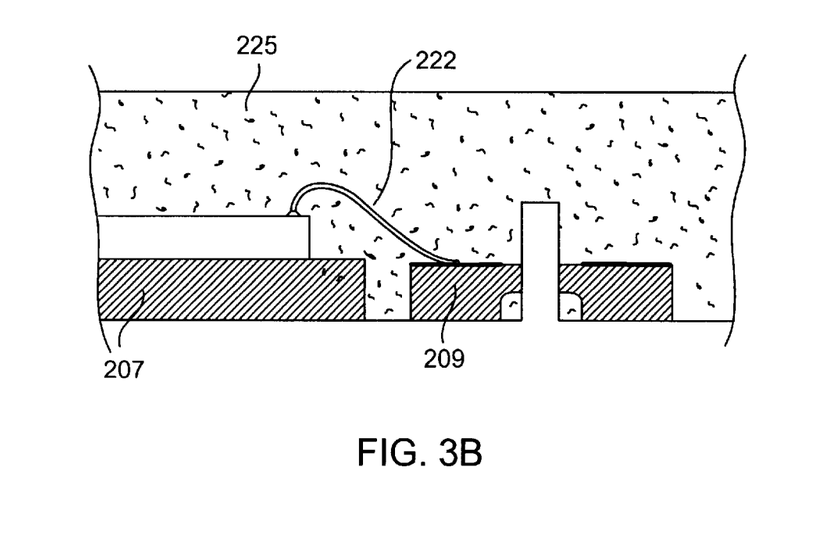
FIG. 3(b) is diagrammatic cross sectional partial side view of the region illustrated in FIG. 3(a) after saw type debussing.

Referring initially to FIGS. 3(a) and 3(b), a first embodiment of the present invention will be described. In this embodiment, the leadless package may (but need not) be produced quite similarly to the conventional leadless package illustrated in FIG. 2. FIG. 3(a) is a cross sectional view illustrating the tie bar region of one suitable device after the caps 225 have been formed. A conventional substrate saw is then used to cut partially through the bottom surface of the package along the tie bars, thereby effectively eliminating the tie bars 240. The depth of the cut 242 can be widely varied. However, the important point is that the depth of the cut must be sufficient to cut through the substrate sheet in the region of the tie bars, thereby eliminating the tie bars. When cutting from the bottom surface, cutting depths on the order of half way through the molding material work well in the types of embodiment shown in FIG. 3(b). However, again, it should be apparent that the actual depth of the cut can be widely varied as long as the unwanted electrical connections between contacts are severed. After the sawing has been completed the packaged devices may be tested in panel form.

Figure 4:
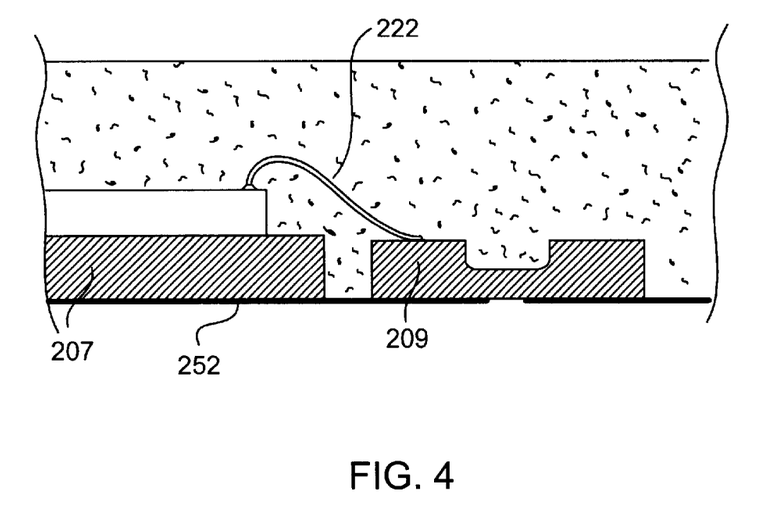
FIG. 4 is a diagrammatic cross sectional partial side view of a leadless package design illustrating the region of a tie bar prepared for etching based debussing.
Figure 5:
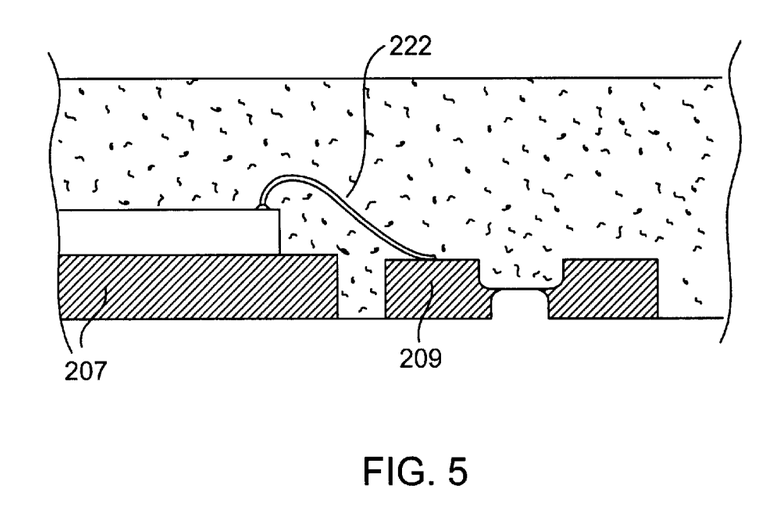
FIG. 5 is a diagrammatic cross sectional partial side view of the region illustrated in FIG. 4 after etching.

Referring next to FIGS. 4 and 5, a second embodiment of the present invention will be described. In this embodiment, the tie bars are etched away rather than sawed. The etching can be done using a wide variety of conventional etching techniques. By way of example, standard photo lithographic etching techniques work well. In one such example, as illustrated in FIG. 4, a standard mask 252 is applied and developed to expose the regions to be etched, which will include the tie bars. An appropriate etchant is then used to etch away the exposed tie bars as best illustrated in FIG. 5. Thereafter the resist is removed and the packaged devices may be tested in panel form.

It is noted that in the embodiment illustrated in FIGS. 4 and 5 (which is intended to have etched tie bars), the tie bars are designed into the conductive substrate such that that they are flush with the bottom surface of the substrate. This makes it easier to etch the tie bars than in situations (such as illustrated in FIG. 3(a)) where the tie bars are raised relative to the bottom surface of the substrate. This is because in the raised environment, molding material would typically be expected to flow about the tie bars thereby requiring extra processing steps to accomplish the etch.

Figure 6A:
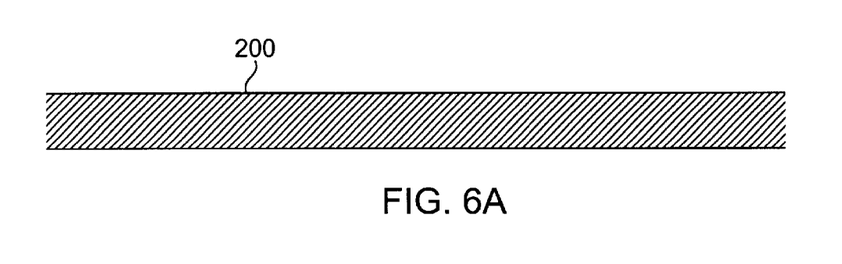
FIGS. 6(a)–6(f) are diagrammatic cross sectional side views illustrating steps involved in packaging an integrated circuit in accordance with one embodiment of the present invention.

Referring next to the sequence of FIGS. 6(a)–6(f), a method of packaging an array of integrated circuits in accordance with various embodiments of the present invention will be described in more detail. A substrate sheet 200 is provided as illustrated in FIG. 6(a). The substrate sheet is formed from a conductive material that is suitable for use as the package contacts. By way of example copper works well and is the material most commonly used in semiconductor packaging applications. However other materials such as aluminum and Alloy may be used instead. The substrate sheet 200 may take any appropriate form factor. Today, much of the packaging handling equipment that is available is designed for handling leadframe strips and therefore, leadframe strips may be used as the substrate sheet. Alternatively, in many respects metal panels (e.g. copper panels) are more appropriate since they will typically have better rigidity and facilitate better space utilization. In the embodiment illustrated in FIG. 7, this type of substrate sheet 200 is used. The panels may take any form although substantially square or rectangular panels are expected to be the most common.

Figure 6B:
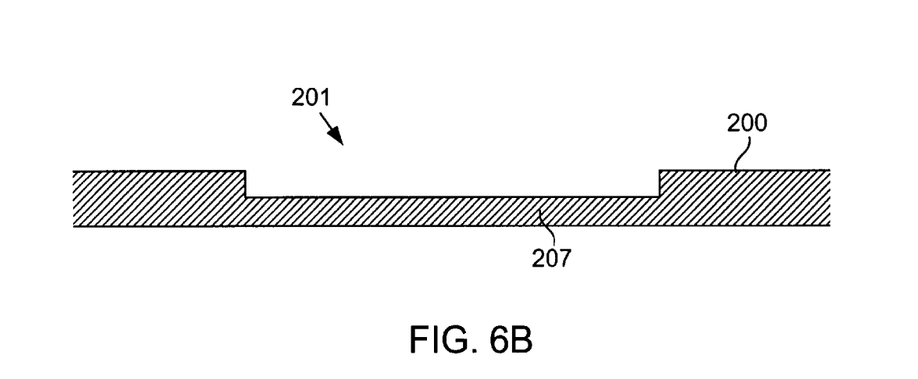
Figure 7:
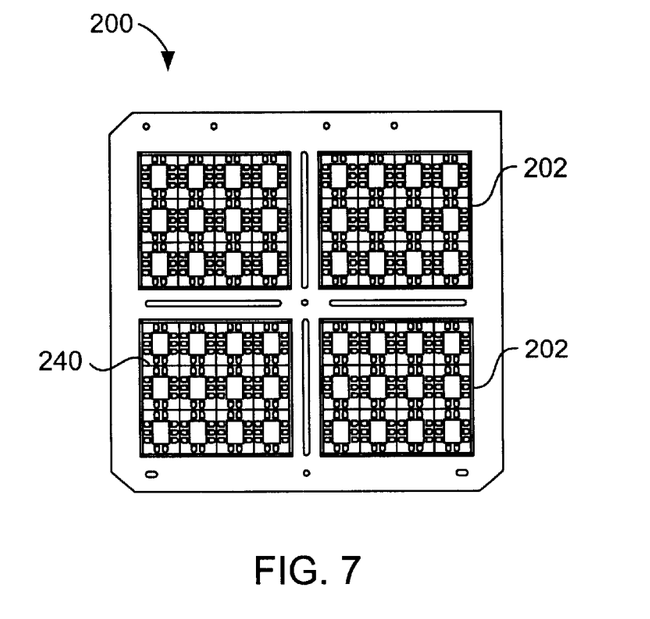
FIG. 7 is a diagrammatic top view of a substrate panel of FIG. 6(c) having a matrix of independent package areas.

In some embodiments it may be desirable to thin the die attach pads relative to the contacts. Some of the advantages of this approach are described in detail in concurrently filed Application No. 09/528,662, which is incorporated herein by reference. This step, however, is entirely optional with respect to the present invention. If it is desirable to thin the die attach pads, the substrate sheet is patterned to form recesses in the regions of the substrate to be thinned as illustrated in FIG. 6(b). The regions to be thinned will typically include at least the die attach pads 207. In embodiments where it is desirable to thin other features (such as forming contact shelves), those regions would be thinned as well. The thinning can be accomplished using a variety of conventional etching techniques. In one specific example a photolithographic based etch process may be used. However, it should be apparent that the techniques, chemistries and or processes used to etch (or grind or otherwise form) the recesses can be widely varied within the scope of the present invention.

Additionally, in some embodiments it is desirable to thin the tie bars 240 relative to the overall thickness of the contacts in order to reduce the amount of metal that must be cut through during the tie bar cutting step. Such thinning can be accomplished on either the top or bottom surface of the substrate sheet 200. If die attach pad thinning is part of the fabrication process, then it may be easy to do the tie bar thinning in the same step as the die attach pad thinning. This would make it preferable to have bottom located tie bars as illustrated in the process shown in FIG. 6. Alternatively, if the bottom surface of the tie bars are thinned (or if different amounts of thinning are desired for tie bar and die attach pad thinning), then two separate etching steps (or other thinning processes) may be used.

Of course, in embodiments which don't contemplate the use of a thinned die attach pad, then the tie bar thinning is accomplished in a separate process. As indicated above, in theory, either the top or bottom side of the tie bars may be thinned. As best illustrated in FIGS. 4 and 5, when it is expected that etching will be used to eventually remove the tie bars, it is generally preferable (but not required) that any tie bar thinning be done on the top surface of the substrate, which helps prevent molding material from forming under the tie bars. This simplifies the tie bar etching process since no layer of molding material needs to be removed prior to the tie bar etch.

In embodiments where sawing is contemplated, it is generally not particularly relevant to the tie bar removal process whether the tie bars are located at the top or bottom surface of the substrate. Rather, only the sawing depth needs to be adjusted appropriately.

After the panel 200 has initially been patterned to define the thinned regions, it is then fully patterned to form one or more arrays 202 of device areas 204 on the surface of the panel 200. In the embodiment illustrated in FIG. 7, four arrays are illustrated in a square type substrate panel 200. It should be appreciated that the number of arrays provided in any particular substrate panel and the number of device areas in each array may be very widely varied in accordance with the needs, constraints and optimizations of the particular manufacturing process. By way of example, arrays having from 3 to 20 devices on each side are commonly used, although larger arrays are possible and it is suspected that as technology develops, higher and higher densities of 50 or more on a side will be used.

Figure 6C:
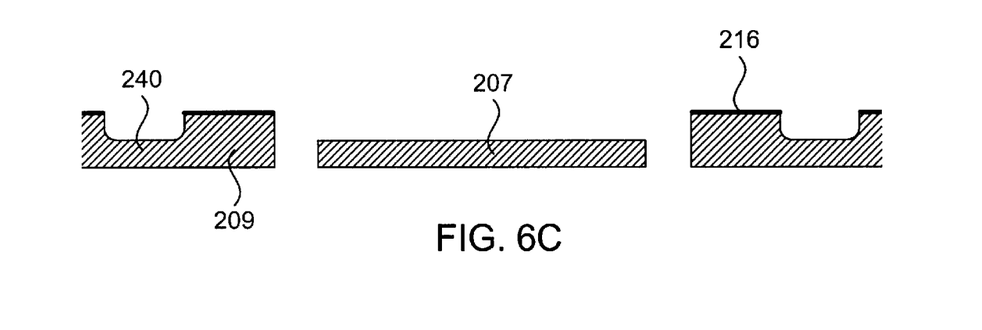
Figure 8:
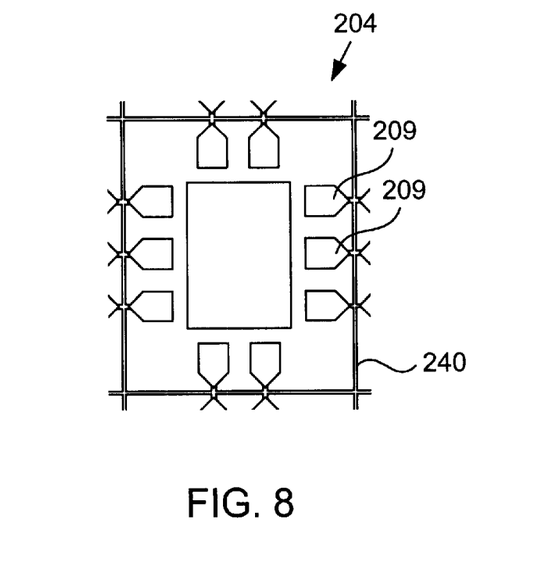
FIG. 8 is a diagrammatic top view the substrate features associated with a single one of the independent package areas illustrated in FIG. 7.
Figure 9A:
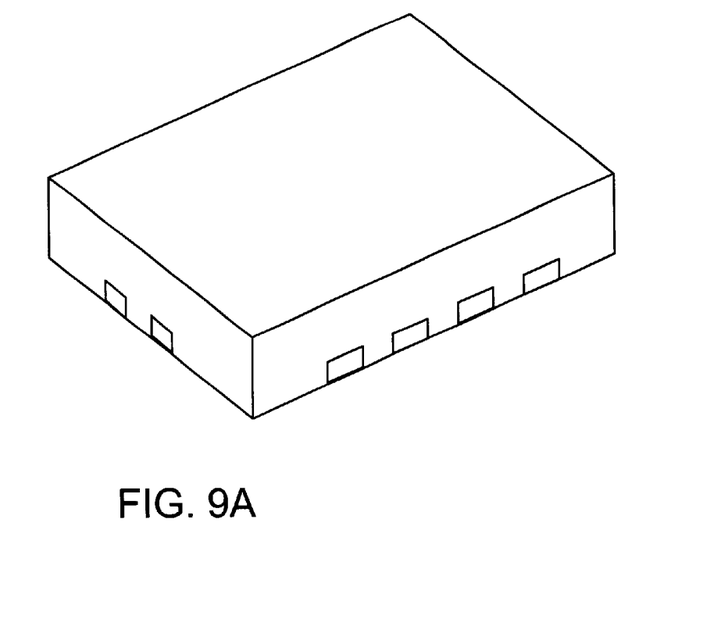
FIGS. 9(a) and 9(b) are perspective top and bottom views of a finished leadless package formed in accordance with one embodiment the present invention.
Figure 9B:
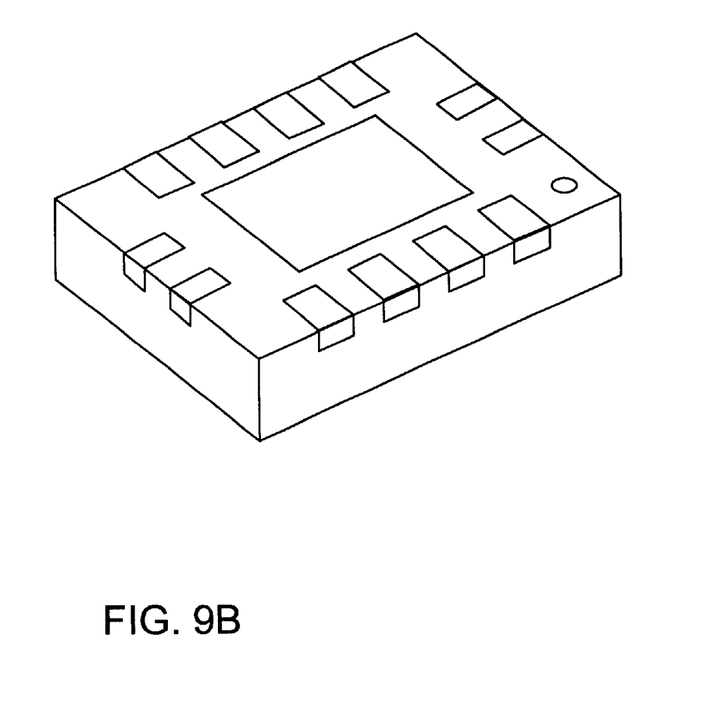

Each device area 204 (illustrated in FIG. 8) has the appropriate surface features formed thereon. Typically, the desired surface features in each device area will include a plurality of contacts 209 and a die attach pad 207, as best illustrated in FIGS. 6(c) and 8. Tie bars 240 are also defined to support the desired surface features. The patterning may be done using any appropriate technology. Today, stamping and etching are the most common.

After the substrate panel 200 has been patterned, it may optionally be plated with a material 216 that facilitates better wire bonding as described below. In the described embodiment, the contact landings 209 are selectively silver plated since as is well known to those skilled in the art, the gold bonding wires bond better with the silver plating than a copper substrate. In other embodiments alternative materials such as palladium-nickel (PdNi) may be plated to onto the contact pads to facilitate bonding. Of course, the actual plating materials used may be widely varied and a number of suitable materials are commercially available.

Figure 6D:
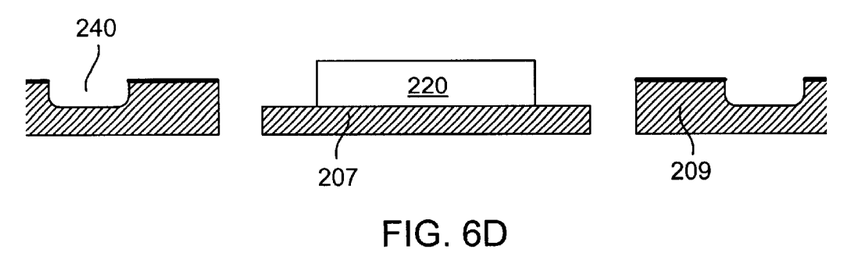
Figure 6E:
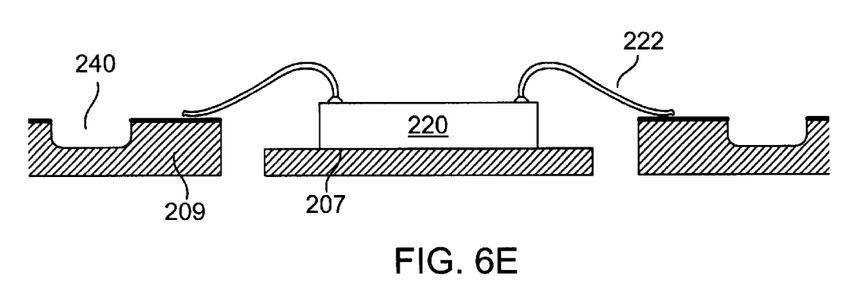

After any desired plating has been done, dice 220 are mounted on the die attach pads 207 using conventional die attachment techniques as illustrated in FIG. 6(d). Generally an adhesive or solder type material is used to secure the dice 220 to their respective die attach pads 207. Thereafter bond pads (not shown) on the dice 220 are electrically connected to associated ones of the contact landings 209. In the embodiment shown, wire bonding is used to electrically connect the dice to their associated contact landings. Thus, as illustrated in FIG. 6(e), bonding wires 222 electrically couple the dice 220 to the contact landings 209. As suggested above, bonding wires are typically formed from gold. When gold bonding wires 222 are used in combination with a copper substrate, it is advantageous to silver (or otherwise) plate to contact landings 209 to improve the adhesion of the bonding wires to the landings.

Figure 6F:
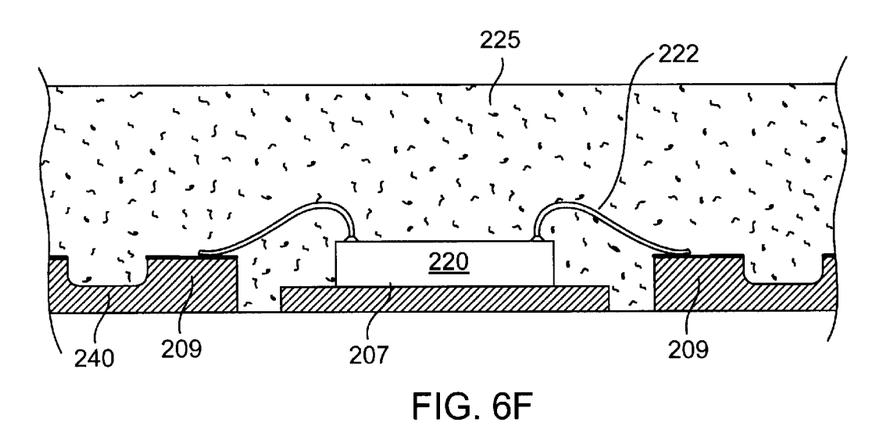

After all of the dice have been wire bonded or otherwise electrically connected to the appropriate contact landings, one or more plastic caps 225 are formed over the substrate panel 200 as illustrated in FIG. 6(f). The plastic caps 225 encapsulates the die 220 and bonding wires 222 and fill the gaps between the die attach pad 207 and the contacts 209 thereby serving to hold the contacts in place. It should be appreciated that during subsequent processing, the tie bars 240 are cut and from then on, the only materials holding the contacts 209 in place will be the molding material.

In the described embodiment, a separate plastic cap is formed over each separate array or matrix 202 of device areas 204. In the embodiment illustrated in FIG. 7, that would include four separate caps as outlined in dashed lines. However, it should be appreciated that a single cap or a different number of caps can readily be provided.

In some processes, we have found it helpful to adhere an adhesive tape (not shown) to the bottom surface of the substrate panel 200 during the assembly. This approach is more fully described in concurrently filed, co-pending Application No. 09/528,539, which is incorporated herein by reference. The tape is typically adhered after the substrate has been patterned and helps support the contacts 209 and die attach pads 207 during the die attach and wire bonding operations. More importantly, the tape also helps prevents flash (i.e. unwanted plastic), from forming on the underside of the substrate panel 200 during the molding process. Preferably, the tape would be removed after the molding operation but before the electrical debussing operation (i.e., removal of the tie bars).

As will be appreciated by those skilled in the art, one potential disadvantage to having a single very large cap 225 that covers a large array on a single large that the cap may induce stresses which adversely affect the dice. Thus, when molding over large panels it is common to logically separate the panel into a plurality of regions (e.g. the separate arrays) in order to reduce the impact of such induced stresses. However, it should be apparent that when the component design parameters and molding process control permits, a single cap may be provided.

In other embodiments, a relatively larger number of caps 225 may be molded over the surface of the substrate panel. One drawback of having too many caps is that in order to form separate caps, a greater spacing is required between adjacent device areas 204 that are under different caps than would be required for adjacent device areas 204 under the same cap. Thus, the density of devices that can be packaged on a particular substrate panel is reduced.

The caps 225 may be formed using any conventional molding process including transfer molding and injection molding. In the described embodiment, a molded array type transfer molding process is used.

After the caps 225 have been formed, any additional process steps that are desired may be performed. As will be appreciated by those skilled in the art, these may include solder plating the exposed surfaces of the contacts 209.

Once the packaging has been substantially completed, the tie bars 240 are eliminated or severed to electrically isolate the various packages from one another and to electrically isolate the contacts 209 from one another as described above. When the packaged devices are electrically isolated, they may be tested in panel form, which has the potential of significant advantages over individual testing of singulated devices. After the devices have been tested, the devices may be singulated using conventional techniques such as sawing. The resulting packaged chips can then be surface mounted on printed circuit boards or other appropriate substrates and/or devices using conventional techniques.

Although the foregoing invention has been described in some detail for purposes of clarity of understanding, it will be apparent that certain changes and modifications may be practiced within the scope of the appended claims. For example, a number of conventional package processing techniques have been described as being used to accomplish particular steps in the formation of the described devices. It should be apparent that in most cases these processing techniques can be widely varied and a wide variety of alternative conventional processes may be used in their place. Accordingly, the present embodiments are to be considered as illustrative and not restrictive, and the invention is not to be limited to the details given herein, but may be modified within the scope and equivalents of the appended claims.

What is claimed is:

1. A method of packaging integrated circuits comprising:
   fabricating an array of leadless integrated circuit devices using a conductive substrate panel having a matrix of device areas thereon, each device area including a plurality of contacts formed from the substrate panel and a die, each die being electrically connected to associated contacts within the same device area, wherein the conductive substrate panel further defines a plurality of tie bars that support the contacts during fabrication;

molding at least one cap over the substrate, each cap being arranged to encapsulate an array of the device areas, thereby forming a molded substrate structure having an array of packaged devices, wherein molding material used in the molding serves to hold the contacts and die in place relative to one another; and removing at least portions of the tie bars to electrically isolate the contacts from one another after the molding operation while leaving sufficient portions of the molded structure intact to facilitate handling the structure in panel form.

2. A method as recited in claim 1 further comprising testing the packaged devices in panel form.

3. A method as recited in claim 2 further comprising singulating the packaged devices after the testing operation.

4. A method as recited in claim 1 wherein a saw is used to remove the tie bars.

5. A method as recited in claim 1 wherein an etching operation is used to remove the tie bars.

6. A method of packaging integrated circuits comprising:

fabricating an array of integrated circuit devices using a leadless leadframe panel having a matrix of device areas thereon, each device area including a plurality of contacts formed from the leadless leadframe panel and a die, each die being electrically connected to associated contacts within the same device area, wherein the leadless leadframe panel further defines a plurality of tie bars that mechanically support and electrically connect the contacts during fabrication;

molding at least one cap over the substrate, each cap being arranged to encapsulate an array of the device areas, thereby forming a molded substrate structure having an array of packaged devices, wherein molding material used in the molding serves to hold the contacts and die in place relative to one another; and removing at least portions of the tie bars to electrically isolate the contacts from one another after the molding operation while leaving sufficient portions of the molded structure intact to facilitate handling the structure in panel form.

7. A method as recited in claim 6 further comprising testing the packaged devices in panel form.

8. A method as recited in claim 7 further comprising singulating the packaged devices after the testing operation.

9. A method as recited in claim 6 wherein a saw is used to remove the tie bars.

10. A method as recited in claim 6 wherein an etching operation is used to remove the tie bars.

* * * * *